(12) United States Patent
Sanderovich

(10) Patent No.: US 8,245,107 B2
(45) Date of Patent: Aug. 14, 2012

(54) TECHNIQUES FOR ENABLING SIMPLIFIED LDPC ENCODING AND DECODING

(75) Inventor: Amichai Sanderovich, Haifa (IL)

(73) Assignee: Wilocity, Ltd., Caesarea (IL)

( * ) Notice: Subject to any disclaimer, the term of this patent is extended or adjusted under 35 U.S.C. 154(b) by 380 days.

(21) Appl. No.: 12/700,893

(22) Filed: Feb. 5, 2010

(65) Prior Publication Data

US 2010/0199143 A1      Aug. 5, 2010

Related U.S. Application Data

(60) Provisional application No. 61/150,124, filed on Feb. 5, 2009.

(51) Int. Cl.
*H03M 13/00* (2006.01)

(52) U.S. Cl. .......................... 714/758; 714/752; 714/798

(58) Field of Classification Search .................. 714/752, 714/758, 798
See application file for complete search history.

(56) References Cited

U.S. PATENT DOCUMENTS

| | | | |
|---|---|---|---|
| 7,627,805 B2 | 12/2009 | Mittelsteadt et al. | |
| 2007/0101229 A1* | 5/2007 | Niu et al. | 714/752 |
| 2007/0143655 A1* | 6/2007 | Niu et al. | 714/752 |
| 2008/0126916 A1 | 5/2008 | Chung et al. | |
| 2009/0235144 A1 | 9/2009 | Senda | |
| 2010/0180173 A1* | 7/2010 | Batra et al. | 714/751 |

\* cited by examiner

*Primary Examiner* — Sam Rizk

(74) *Attorney, Agent, or Firm* — Myers Wolin, LLC

(57) ABSTRACT

A method for low density parity check (LDPC) encoding comprises concatenating a predetermined number of zero bits to a scrambled input data word to generate a concatenated binary sequence; computing parity bits to be added to the concatenated binary sequence, wherein the computing is performed using an LDPC encoder; producing an encoded codeword that consists of the concatenated binary sequence and the parity bits; and replacing the predetermined number of zero bits in the encoded codeword with a scrambled binary sequence, thereby discarding the zero bits.

19 Claims, 6 Drawing Sheets

TECHNIQUES FOR ENABLING SIMPLIFIED LDPC ENCODING AND DECODING

CROSS-REFERENCE TO RELATED APPLICATIONS

This application claims the benefit of U.S. Provisional Patent Application No. 61/150,124 filed on Feb. 5, 2009, the contents of which are herein incorporated by reference.

TECHNICAL FIELD

The invention generally relates to techniques for encoding and decoding data in a wireless communication system.

BACKGROUND OF THE INVENTION

In wireless transmission of data the error rate of received data is relatively high, due to many factors including, for example, interference. To improve the performance of wireless communication systems data to be transmitted is encoded using an error correction code that can be recovered by the receiver.

One technique discussed in the related art to decode data is a low density parity check (LDPC) encoding which is based on an LDPC code. The LDPC code utilizes a sparse parity check matrix. In LDPC coding, the sparse parity matrix can be generated either randomly or by algebraic methods and subject to predefined constraints.

FIG. 1 shows a schematic diagram of a signal-carrier modulation transmitter 100 that performs LDPC encoding. The transmitter 100 includes a scrambler 110 for scrambling the bits of an input data word using a polynomial function, a repetition unit 120 that duplicates the scrambled input word, and a linear feedback shift register (LFSR) 130 for scrambling the output of the repetition unit 120 to generate a scrambled repeated word.

The transmitter 100 also includes an LDPC encoder 140 of rate 1/k (k=2 or 4) having a code length of N (N is an integer number). The inputs to the LDPC encoder 140 are the scrambled repeated data word and the scramble input data word, each data word is in length of N/4 bits. The LDPC encoder 140 must receive a word in a length that is twice that of the length of the input data word. The LDPC encoder 140 computes the parity bits (2/N bits) using a parity matrix and outputs an encoded codeword having a length of N bits. The encoded codeword is modulated using a signal carrier modulator 150 and transmitted over a wireless medium to a receiver.

The receiver should decode the received signal using an LDPC decoder. In order to properly decode the signal, the decoder should have an indication on the location of the scrambled input data word and the scrambled repeated data word in the received signal. This complicates the implementation of the receiver as it requires additional hardware and a modified LDPC decoder to distinguish between the different data words. FIGS. 2A, 2B and 2C show block diagrams of different conventional implementations of signal-carrier modulation receivers.

The receiver 200 shown in FIG. 2A includes a standard LDPC decoder 201 of 1/k rate that requires two different channels 202 and 203 in order to perform error checking of one each of the scrambled input data word and the scrambled repeated data word included in the received signal. The output of the channel with a minimum number of errors is selected. The implementation of the receiver 200 is relatively simple, but it suffers from poor performances (e.g., a high error rate).

The receiver 210 shown in FIG. 2B consists of a maximum ratio combining (MRC) unit 213 that combines the scrambled input data word and the scrambled repeated data word. The input to the LDPC decoder 214 are two data words, each of which having a length of N/2 and the parity matrix. The receiver 210 also includes two channels 211 and 212 to error check the data word included in the received signal. Although the receiver 210 provides improved performance in comparison to the receiver 200, still its error rate when decoding received signals is relatively high. In addition, two channels and a MRC unit are needed to implement the receiver 210.

The receiver 220 depicted in FIG. 2C provides optimal performance in terms of error rates, but necessitates implementing a modified LDPC decoder 221 with a shorten LDPC code (e.g., 3N/4 instead of N). This is a costly approach as it requires designing a receiver with non-standard decoders and other components.

It would be therefore advantageous to provide a solution that would limit the drawbacks of existing LDPC coding based receivers and transmitters.

BRIEF DESCRIPTION OF THE DRAWINGS

The subject matter that is regarded as the invention is particularly pointed out and distinctly claimed in the claims at the conclusion of the specification. The foregoing and other objects, features and advantages of the invention will be apparent from the following detailed description taken in conjunction with the accompanying drawings.

DETAILED DESCRIPTION OF THE INVENTION

Figure 1:
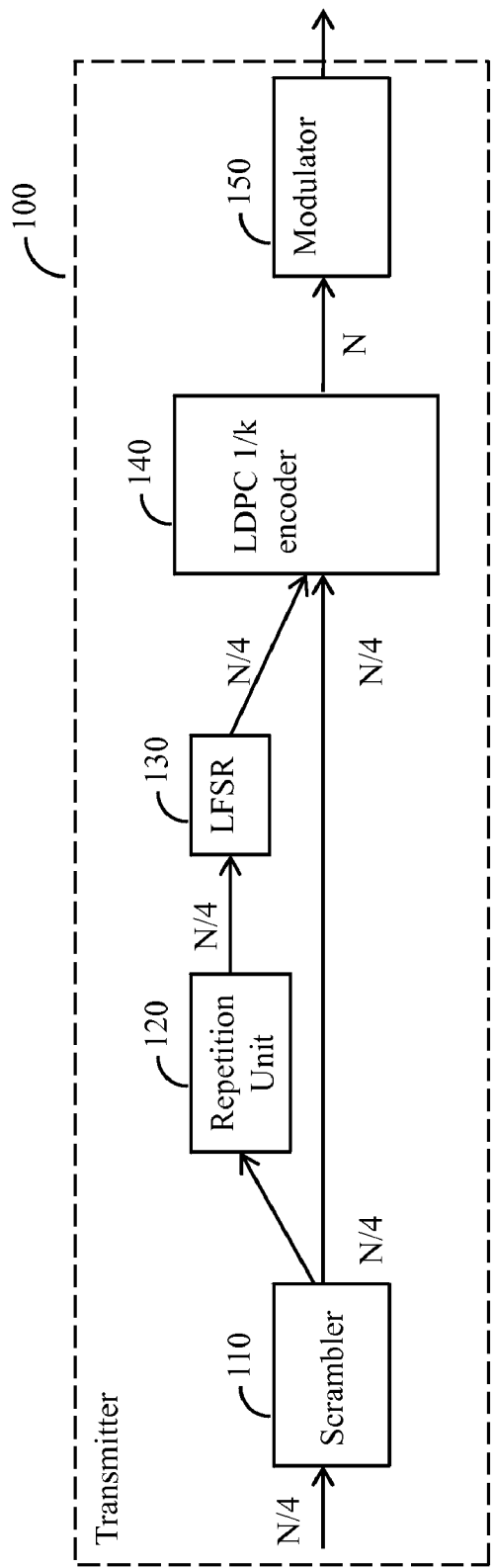
FIG. 1 is schematic diagram of a signal-carrier modulation transmitter that performs LDPC encoding.

The embodiments disclosed by the invention are only examples of the many possible advantageous uses and implementations of the innovative teachings presented herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

Figure 3:
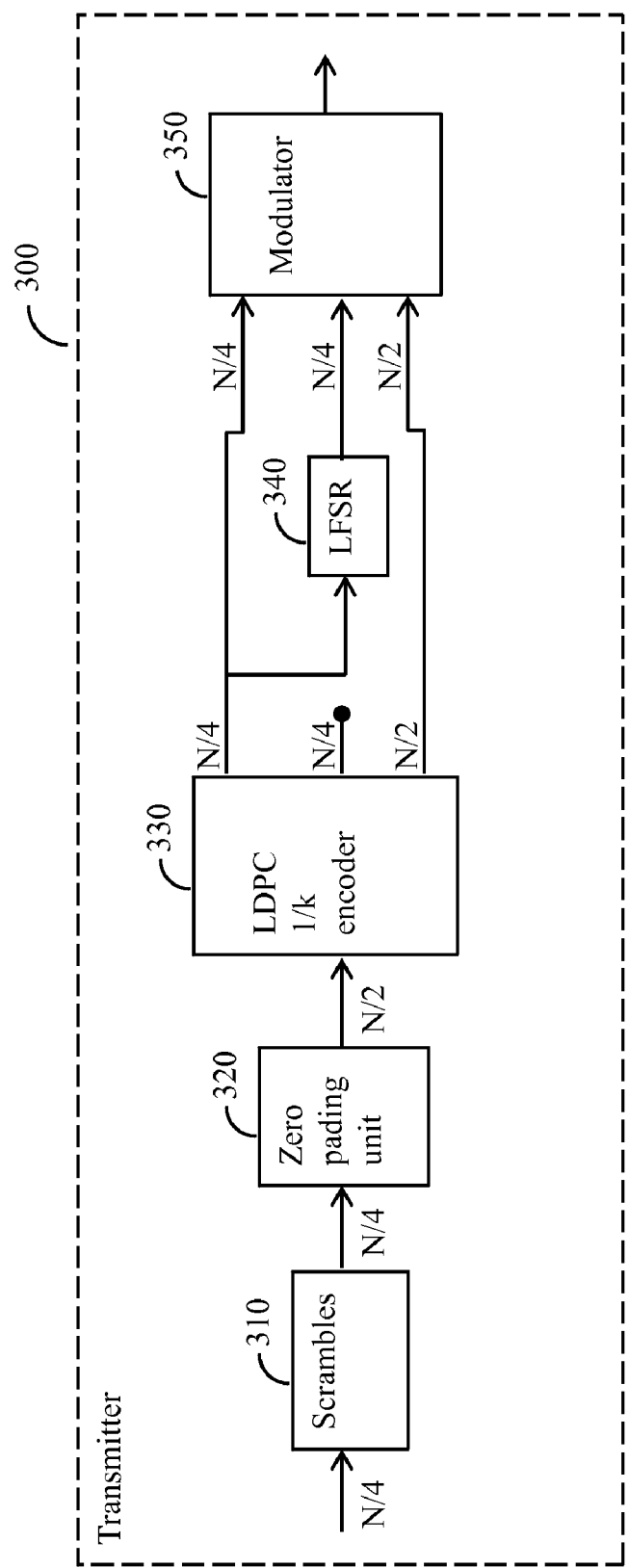
FIG. 3 is a block diagram of a single-carrier transmitter implemented in accordance with an embodiment of the invention.

FIG. 3 shows a non-limiting and exemplary block diagram of a single-carrier transmitter 300 implemented in accordance with an embodiment of the invention. The transmitter 300 is constructed to enable efficient LDPC encoding and to simplify the LDPC decoding, hence the implementation of a single-carrier receiver. The transmitter 300 uses zero padding bits to double the length of an input data word to a length of N/4. The padded input data code word is encoded using an LDPC encoder to output an encoded codeword having a length of N. The parameter N is an integer number representing the length of an LDPC code utilized by the LDPC encoder.

As illustrated in FIG. 3, the transmitter 300 includes a scrambler 310, a zero padding unit 320, an LDPC encoder 330, a LFSR 340, and a modulator 350. The scrambler 310 scrambles the bits of an input data word to a length of N/4, using a polynomial function, to generate a scrambled input data word. The zero padding unit 320 suffixes or prefixes a number of N/2 zero bits to the scrambled input data word to produce a padded input data word having a length of N/2. The LDPC encoder 330 encodes the padded data word using an LDPC code of a length N and a rate of 1/k. The output of the LDPC encoder 330 is an encoded codeword that consists of N/4 zero bits, N/4 bits of the scrambled input data word, and N/2 computed parity bits.

In accordance with a preferred embodiment of the invention, the rate of the LDPC encoder 330 is ½ and the LDPC code length is 672. This leads to a total rate of ¼, and an encoded codeword in a length 672. The encoded codeword (c) may be represented as follows:

c=[U 0 P], where U is 168 information bits, 0 is 168 zeros and P is 336 parity bits.

At the output of the LDPC encoder 330, the N/4 zero bits are discarded as these bits are not being transmitted. The N/4 information bits (originated from the scrambled input data word) are repeated by means of the LFSR 340. To this end, the N/4 information bits are XORed with a polynomial sequence generated by the LFSR 340. In accordance with an embodiment of the invention the LFSR 340 is initialized, for each input data word, with a vector that includes only '1' bits.

The input of the modulator 350 consists of the N/4 bits of the encoded information bits, N/4 bits which are the scrambled encoded information bits, and N/2 parity bits. The modulator 350 modulates its input onto a single carrier signal being transmitted to the receiver over the wireless medium. The modulator 350 may be, but is not limited to, a binary phase-shift keying (BPSK) modulator, a Quadrature phase-shift keying (QPSK) modulator, a differential phase-shift keying (DPSK) modulator, and the like.

It should be appreciated that in comparison to the transmitter shown in FIG. 1, in the transmitter 300 the repetition of the input data word is performed after the encoding. This approach simplifies both the LDPC encoding and decoding in the transmitter and receiver respectively. Specifically, the LDCP encoder 330 solves the same set of equations as in a conventional transmitter, but with half the number of input variables. The LDPC decoder is simplified since there are no statistical dependencies between the inputs to the LDPC decoder beyond the code-induced dependencies. Therefore, a standard LDPC decoder would ensure optimal performance, i.e., a low error rate.

Figure 4:
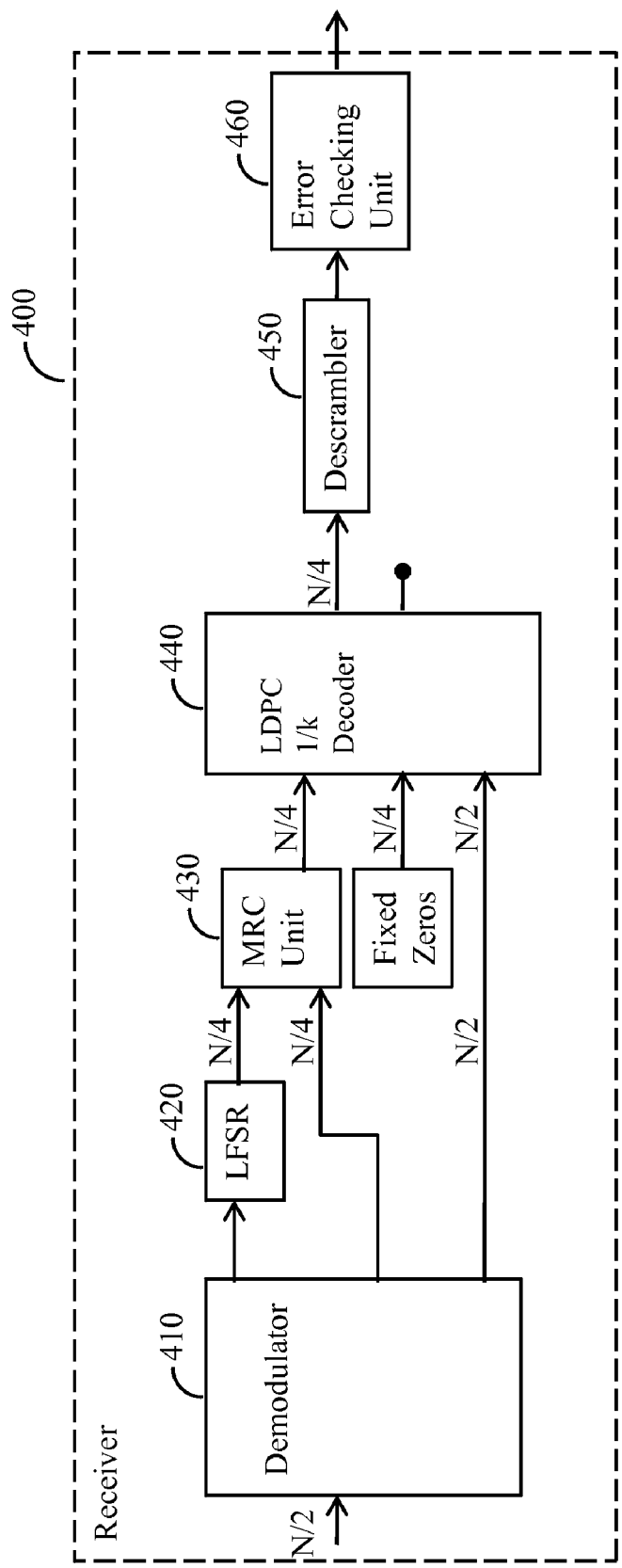
FIG. 4 is a block diagram of a single carrier receiver constructed in accordance with an embodiment of the invention.

FIG. 4 shows an exemplary and non-limiting block diagram of a single carrier receiver 400 constructed in accordance with an embodiment of the invention. The receiver 400 is designed to efficiently decode signals generated and transmitted, for example, by the single carrier transmitter 300. The receiver 400 includes a demodulator 410, a LFSR 420 that performs a descrambling function, a MRC unit 430, an LDPC decoder 440, a descrambler 450, and an error checking unit 460.

The demodulator 410 demodulates the received signal and outputs 3 data blocks including the N/4 encoded information bits, N/4 bits which are the scrambled encoded information bits, and N/2 parity bits. The demodulator 410 may be, but is not limited to, a binary phase-shift keying (BPSK) demodulator, a Quadrature phase-shift keying (QPSK) demodulator, a differential phase-shift keying (DPSK) demodulator, and the like. The LSFR 420 descrambles the N/4 bits of the scrambled encoded information bits, which are then combined with the N/4 encoded information bits using the MRC unit 430.

The combined data word produced by the MRC unit 430 has a length of N/4 bits. The LDPC decoder 440 decodes a codeword that consists of the N/2 parity bits, N/4 zero bits, and N/4 bits of the combined data word to generate a decoded codeword that includes only N/4 bits (i.e., a length of the input data word at the transmitter). In accordance with the principles of the invention the LDPC decoder 440 is a standard LDPC decoder, thus no modification is required. In addition, the input to LDPC decoder 440 are data blocks of the respective encoded data blocks. Therefore, there is no need to provide any indication to the decoder 440 on the exact location of the repeated information in its input. This simplifies the design of the receiver 400 and further reduces its cost. The LDPC decoder 440 decodes the padded data word using an LDPC code of a length N and a rate of 1/k. In accordance with a preferred embodiment of the invention, the rate of the LDPC decoder 440 is ½ and the LDPC code's length is 672.

Figure 2A:
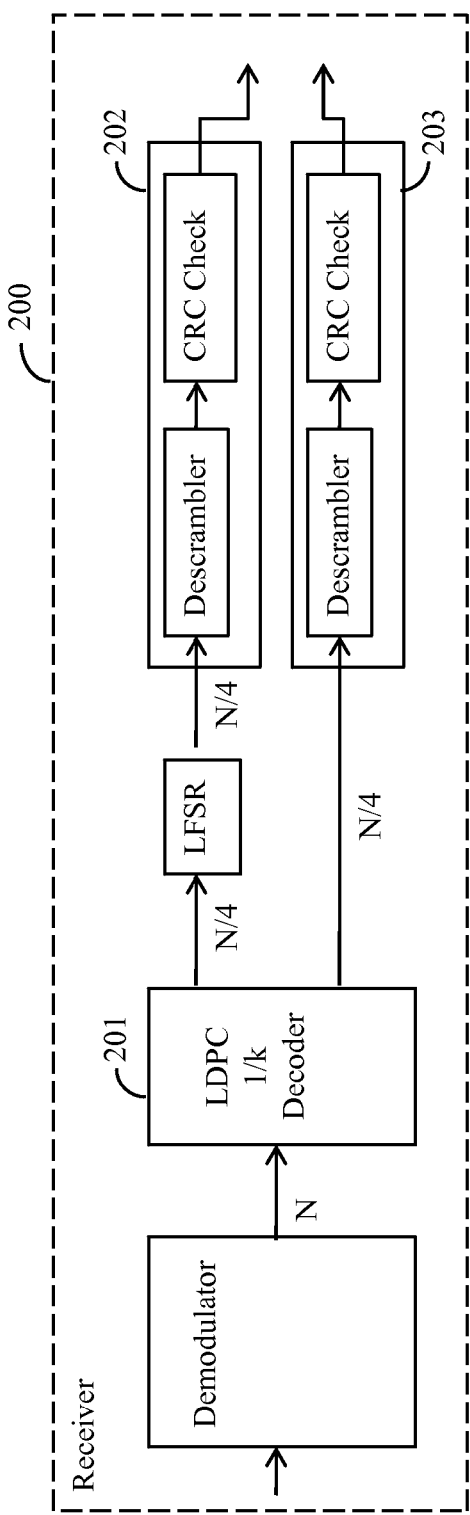
FIGS. 2A, 2B and 2C are blocks diagrams of different implementations of signal-carrier modulation receivers.
Figure 2B:
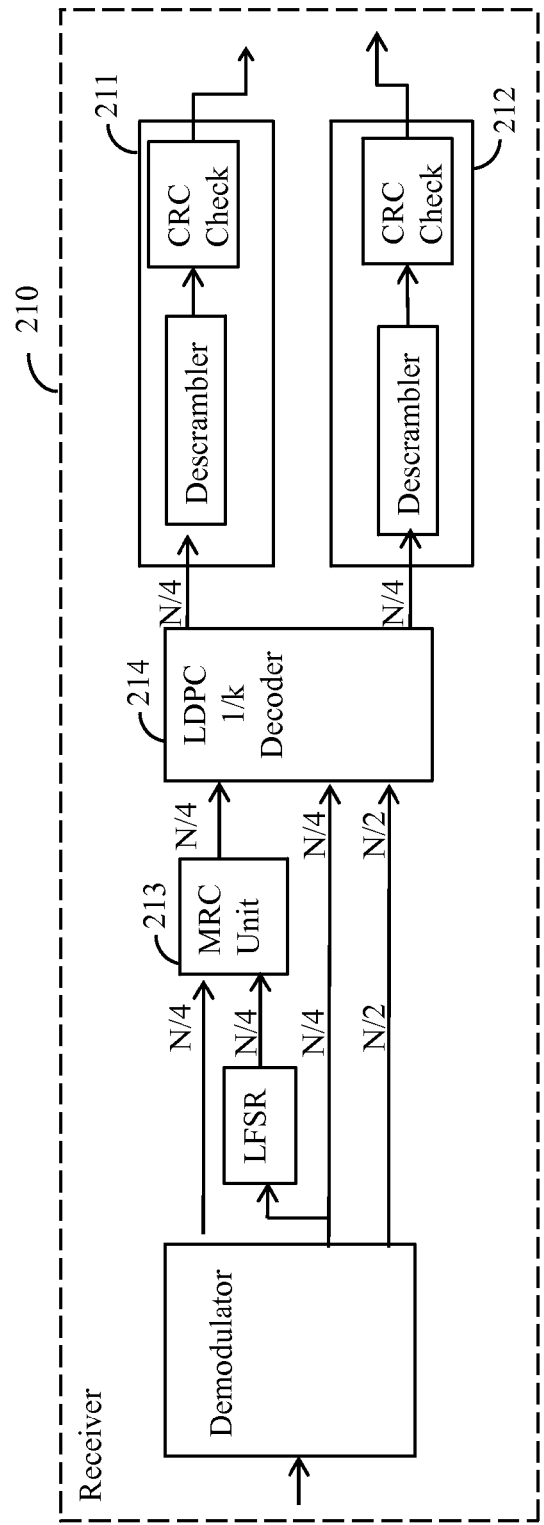
Figure 2C:
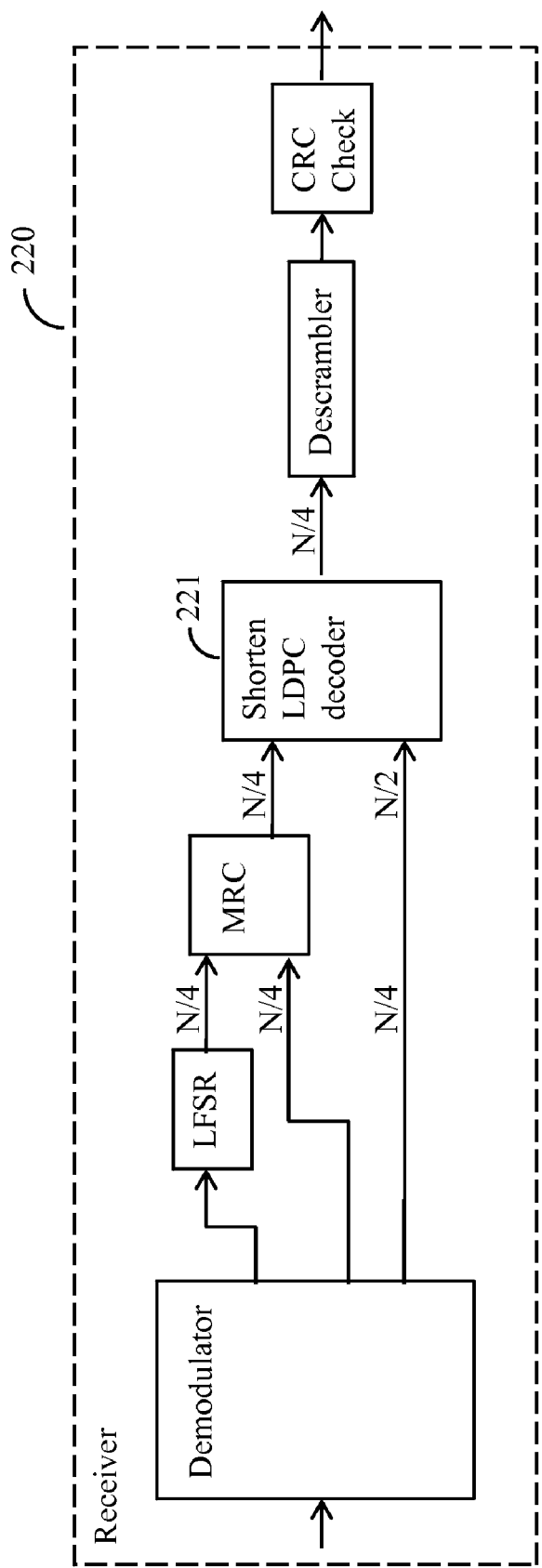

The decoded codeword is descrambled by the descrambler 450 and then an error checking, e.g., using cyclic redundancy check (CRC) is performed using the unit 460. It should be appreciated that in comparison to the receivers shown in FIGS. 2A and 2B, the error checking function is not duplicated, as the receiver 400 can provide optimal performance using only one error checking unit.

It should be apparent to one of ordinary skilled in the art that the teachings of the LDPC encoding and decoding as being implemented in the transmitter 300 and the receiver 400 can be easily adapted to be utilized in OFDM transmitters and receivers. That is, in certain embodiments of the invention the transmitter 300 and receiver 400 can be adapted to perform OFMD modulation and demodulation respectively.

Figure 5:
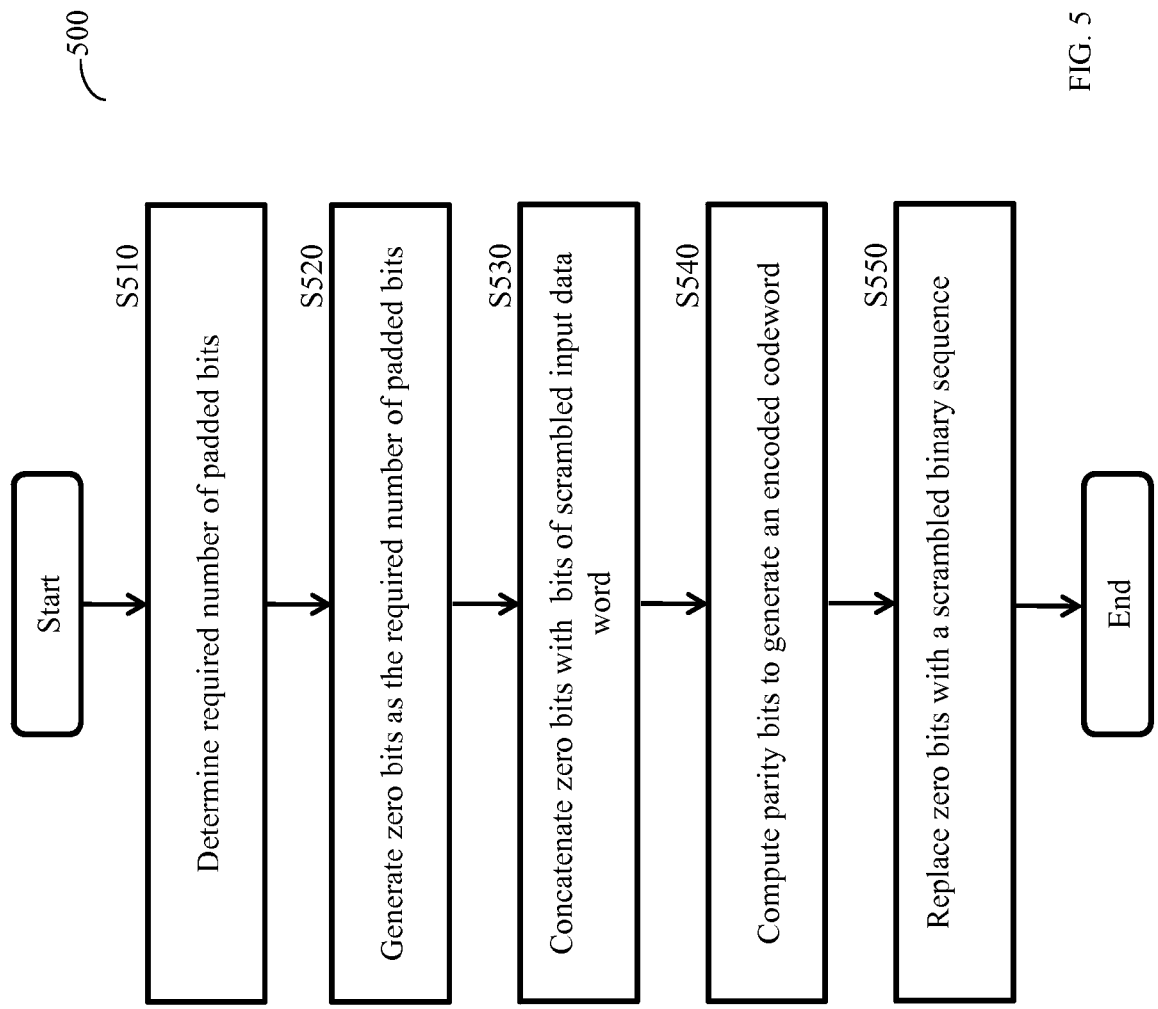
FIG. 5 is a flowchart illustrating an LDPC encoding process implemented according to an embodiment of the invention.

FIG. 5 shows an exemplary and non-limiting flowchart 500 illustrating an LDPC encoding process implemented according to an embodiment of the invention. At S510, a number of padded bits required for the encoding is computed. This number is based on a repetition factor, a length of the LDPC code, and a length of an input data word. For example, if the lengths of the input data word and the LDPC code are respectively 168 and 672 and the repetition factor is 1, the number of padded zero bits is 168. At S520, zero bits are generated as the computed number padded bits. At S530 data bits of an input scrambled data word are concatenated with the zero bits to generate a binary sequence having a length as the number of padded bits plus the number of bits in the input scrambled data word. For instance, if there are N/4 zero bits and N/4 bits of the input scrambled data word, the length of the concatenated binary sequence is N/2. This sequence can be represented as follows:

$[b_1, b_2, \ldots, b_{N/4}, 0_{N/4+1}, 0_{N/4+2}, \ldots, 0_{N/2}]$.

At S540, the parity bits are computed using an LDPC encoder based on the concatenated sequence and an LDPC code. The output of the LDPC encoder is an encoded codeword (c), which may be computed as follows:

$Hc^T=0$, wherein H is the parity matrix and T is a transform matrix.

If the length of the LDPC code is N and the input concatenated sequence is as shown above, the length of the encoded codeword (c) is N:

$c=[b_1, b_2, \ldots, b_{N/4}, 0_{N/4+1}, 0_{N/4+2}, \ldots 0_{N/2}, p_{N/2+1}, \ldots, p_N]$, where $p_{N/2+1}, \ldots, p_N$ are the parity bits.

Finally, at S550, the zero bits (e.g., $0_{N/4+1}, 0_{N/4+2}, \ldots, 0_{N/2}$) in the encoded codeword (c) are replaced with a binary scrambled sequence being generated by performing a logic XOR function between the data bits (e.g., $b_1, b_2, \ldots, b_{N/4}$) and a binary sequence generated by a LFSR or any other scrambler. This results with a new encoded codeword (c') that may be represented as follows:

$c' = [b_1, b_2, \ldots, b_{N/4}, b'_{N/4+1}, b'_{N/4+2}, \ldots, b_{N/2}, p_{N/2+1}, \ldots, p_N]$, wherein $b'_{N/4+1}, b'_{N/4+2}, \ldots, b'_{N/2}$, are the new bits.

The new encoded codeword (c') may be further processed in order to enable its modulation over a single-carrier signal or an OFDM signal.

The principles of the invention can be implemented as hardware, firmware, software or any combination thereof. Moreover, the software is preferably implemented as an application program tangibly embodied on a program storage unit, computer readable medium, or machine readable medium. One of ordinary skill in the art would recognize that a "machine readable medium" is a medium capable of storing data and can be in a form of a digital circuit, an analogy circuit or combination thereof. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

The invention claimed is:

1. A single-carrier transmitter, comprising:
a scrambler for scrambling an input data word,
a zero padding unit for concatenating a predetermined number of zero bits to the scrambled input data word;
a low density parity check (LDPC) encoder for generating an encoded codeword that consists of the scrambled input data word, the predetermined number of zero bits and parity bits;
a linear feedback shift register (LFSR) for replacing the predetermined number of zero bits in the encoded codeword with a binary scrambled sequence; and
a modulator for modulating a modified encoded codeword that consists of scrambled input data word, a scrambled binary sequence, and the parity bits on a single carrier signal.

2. The transmitter of claim 1, wherein the length of a LDPC code of the LDPC encoder is N.

3. The transmitter of claim 2, wherein the input data word is in a length of N/4, the predetermined number of zero bits is N/4, the number of parity bits is N/2, and the encoded codeword is in a length of N.

4. The transmitter of claim 3, wherein the parameter N equals to 672.

5. The transmitter of claim 1, wherein a rate of the LDPC encoder is ½.

6. The transmitter of claim 1, wherein replacing the predetermined number of zero bits with the scrambled binary sequence, further comprises:
performing a logical XOR operation between bits of the scrambled input data word and a polynomial sequence generated by the LFSR.

7. The transmitter of claim 1, wherein modulator is any of a phase-shift keying (BPSK) modulator, a Quadrature phase-shift keying (QPSK) modulator, and a differential phase-shift keying (DPSK) modulator.

8. A method for low density parity check (LDPC) encoding, comprising:
concatenating a predetermined number of zero bits to a scrambled input data word to generate a concatenated binary sequence;
computing parity bits to be added to the concatenated binary sequence, wherein the computing is performed using an LDPC encoder;
producing an encoded codeword that consists of the concatenated binary sequence and the parity bits; and
replacing the predetermined number of zero bits in the encoded codeword with a scrambled binary sequence, thereby discarding the zero bits.

9. The method of claim 8, wherein a length of a LDPC code of the LDPC encoder is N.

10. The method of claim 9, wherein the scrambled input data word is in a length of N/4, the predetermined number of zero bits is N/4, the number of parity bits is N/2, and the encoded codeword is in a length of N.

11. The method of claim 10, wherein the parameter N equals to 672.

12. The method of claim 8, wherein a rate of the LDPC encoder is ½.

13. The method of claim 8, wherein replacing the predetermined number of zero bits with the binary scrambled sequence, further comprises:
performing a logic XOR function between bits of the scrambled input data word and a polynomial sequence generated by a linear feedback shift register (LFSR).

14. A single-carrier receiver, comprising:
a demodulator for demodulating a received wireless signal to extract a transmitted encoded codeword, wherein the encoded codeword consists of a scrambled input data word, a scrambled binary sequence, and parity bits;
a linear feedback shift register (LFSR) for descrambling the binary scrambled sequence;
a maximum ratio combining (MRC) unit for combining the descrambled scrambled binary sequence and the scrambled input data word; and
an LDPC decoder for decoding an input codeword that consists of a combined binary sequence generated by the MRC unit, a predetermined number of zero bits, and the parity bits, wherein the low density parity check (LDPC) decoder outputs a decoded input data word.

15. The single-carrier receiver of claim 14, further comprises:
a descrambler for descrambling the decoded input data word; and
an error checking unit for detecting and correcting errors in the descrambled decoded input data word.

16. The single-carrier receiver of claim 15, wherein a length of a LDPC code of the LDPC decoder is N.

17. The single-carrier receiver of claim 16, wherein the combined binary sequence is in a length of N/4, the predetermined number of zero bits is N/4, the number of parity bits is N/2, and the decoded input data word is in a length of N/4.

18. The single-carrier receiver of claim 17, wherein the parameter N equals to 672.

19. The single-carrier receiver of claim 15, wherein a rate of the LDPC decoder is ½.

* * * * *